United States Patent
Uemura et al.

(10) Patent No.: US 7,096,873 B2
(45) Date of Patent: Aug. 29, 2006

(54) METHOD FOR MANUFACTURING A GROUP III NITRIDE COMPOUND SEMICONDUCTOR DEVICE

(75) Inventors: Toshiya Uemura, Aichi (JP); Naoki Nakajo, Aichi (JP)

(73) Assignee: Toyoda Gosei Co., Ltd., Nishikasaugai-gun (JP)

( * ) Notice: Subject to any disclaimer, the term of this patent is extended or adjusted under 35 U.S.C. 154(b) by 47 days.

(21) Appl. No.: 09/935,699

(22) Filed: Aug. 24, 2001

(65) Prior Publication Data

US 2002/0043331 A1    Apr. 18, 2002

(30) Foreign Application Priority Data

Aug. 25, 2000    (JP)    ............... 2000-256379

(51) Int. Cl.
*B08B 5/00*    (2006.01)

(52) U.S. Cl. ............... 134/1.3; 134/1; 216/62; 216/63; 216/66; 216/75; 216/76; 216/77; 438/906; 438/604; 438/606

(58) Field of Classification Search ............ 134/1, 134/1.3, 902; 438/604, 606, 706, 707, 708, 438/906; 216/95, 96, 100, 102, 62, 63, 66, 216/75, 76, 77

See application file for complete search history.

(56) References Cited

U.S. PATENT DOCUMENTS

| | | | | |
|---|---|---|---|---|
| 4,987,008 A | * | 1/1991 | Yamazaki et al. | ......... 438/694 |
| 5,205,905 A | | 4/1993 | Kotaki et al. | ............... 156/662 |
| 5,278,433 A | | 1/1994 | Manabe et al. | ............. 257/103 |
| 5,281,830 A | | 1/1994 | Kotaki et al. | ................. 257/86 |
| 5,451,542 A | * | 9/1995 | Ashby | ........................ 438/767 |
| 5,525,542 A | * | 6/1996 | Maniar et al. | ............. 438/669 |
| 6,008,539 A | | 12/1999 | Shibata et al. | .............. 257/745 |
| 6,009,888 A | * | 1/2000 | Ye et al. | ...................... 134/1.3 |
| 6,447,604 B1 | * | 9/2002 | Flynn et al. | .................. 117/89 |
| 6,628,078 B1 | * | 9/2003 | Inayoshi | ..................... 313/607 |

FOREIGN PATENT DOCUMENTS

| JP | 10012916 | * | 1/1998 |
|---|---|---|---|
| JP | 2000306854 | * | 11/2000 |

OTHER PUBLICATIONS

W.Kern. Handbook of semiconductor wafer cleaning technology. Noyes Publications, 1993. pp. 233-239, 262-263.*

* cited by examiner

*Primary Examiner*—M. Kornakov
(74) *Attorney, Agent, or Firm*—McGinn IP Law Group, PLLC

(57) ABSTRACT

A method for manufacturing a group III nitride compound semiconductor device includes irradiating a surface of a wafer with ultraviolet rays to thereby clean a resist residue from the surface of the wafer, the surface including a group III nitride compound semiconductor. The ultraviolet rays cause a reaction of oxygen molecules to form stimulated oxygen atoms having a strong oxidative power at the surface.

13 Claims, 4 Drawing Sheets

METHOD FOR MANUFACTURING A GROUP III NITRIDE COMPOUND SEMICONDUCTOR DEVICE

BACKGROUND OF THE INVENTION

1. Field of the Invention

The present invention relates to the improvement of a cleaning method applied to manufacturing of a group III nitride compound semiconductor device.

The present application is based on Japanese Patent Application No. 2000-256379, which is incorporated herein by reference.

2. Description of the Related Art

When a light-emitting device which is an example of a group III nitride compound semiconductor device is to be manufactured, a light-transmissible electrode, a p-type seat electrode, and an n-type seat electrode are formed by photolithography. However, residues of a photo resist and other contaminations adhere to the surface of a wafer. It is therefore necessary to perform cleaning. Particularly, of group III nitride compound semiconductors, a p-type one has high electric resistance to be electrified easily. As a result, the contaminations are apt to be sucked thereon. If the contaminations are left as they are, not only is the light-emitting device defaced, but the adhesion of a protective film also deteriorates. In addition, if the contaminations are put between an electrode and a semiconductor layer, unevenness of light emission is produced or a driving voltage is increased to thereby cause a defect of lowering the light emission efficiency or the like.

Cleaning which is an object of the present invention is to perform ashing on organic contaminations such as resist residues and so on to thereby remove the contaminations from the wafer surface.

As a method for such cleaning, there have been known conventionally a chemical treatment method, an $O_2$ plasma treatment method (plasma ashing), and so on.

However, when such a treatment method is to be applied to a light-emitting device constituted by a group III nitride compound semiconductor, there have been problems as follows. Chemical Treatment Method A light-transmissible electrode which is a thin film is generally provided in a light-emitting device. This light-transmissible electrode is eroded by chemicals. In addition, aluminum for use in an n-type seat electrode (n-type contact electrode) is likewise eroded by chemicals.

$O_2$ Plasma Treatment Method (Plasma Ashing)

In a light-emitting device using a sapphire substrate, the top layer (contact layer) thereof is formed as a p-type semiconductor layer. Since the p-type semiconductor layer has high electric resistance, the p-type semiconductor layer is electrified when plasma is generated. Because of this electrification, the crystal of the p-type semiconductor layer is damaged so that its electric properties deteriorate. In addition, metal elements of the light-transmissible electrode are oxidized in high degree so that the contact resistance between the light-transmissible electrode and the p-type semiconductor layer becomes high.

Each of the above-mentioned phenomena increases a driving voltage (Vf) of the light-emitting device or causes a short-circuit current (leakage). Therefore, such phenomena are not acceptable from the point of view of the light-emitting efficiency of the light-emitting device. Thus, if cleaning the wafer surface is promoted strongly, there is a fear that the properties of the light-emitting device itself are affected. It is therefore necessary to limit the degree of cleaning.

Further, when such a chemical treatment method is to be executed, chemical collecting equipment or chemical cleaning equipment is required. Similarly, in execution of the $O_2$ plasma treatment method, plasma generating equipment is required. Therefore, a large scale of the manufacturing equipment is needed for each of the treatment methods. This caused an increase in the manufacturing cost of the light-emitting device.

SUMMARY OF THE INVENTION

The present invention was developed to solve the foregoing problems. The present invention has a feature in cleaning with ultraviolet rays.

As far as a light-emitting device is irradiated with ultraviolet rays, a group III nitride compound semiconductor or an electrode material of the light-emitting device is not denatured at all. Thus, the properties of the light-emitting device itself are kept up. In addition, to carry out cleaning according to the present invention, it will go well if only an ultraviolet ray emitting source (cathode ray tube or the like) is prepared. Thus, the manufacturing equipment is also simplified. It is therefore easy to carry out the cleaning step, and it is possible to reduce the manufacturing cost of the light-emitting device.

The wavelength of the ultraviolet rays is not limited specifically if the ultraviolet rays have enough energy to oxidize and remove organic contaminations such as resist residues and so on from the device.

As the ultraviolet ray source available presently, there are a low-pressure mercury lamp and an excimer lamp. It is considered that cleaning is carried out by the following reaction caused by ultraviolet rays of a wavelength of 185 nm and a wavelength of 254 nm emitted from the low-pressure mercury lamp.

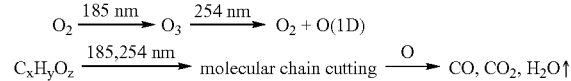
(Formula 1)

On the other hand, it is considered that cleaning is carried out by the following reaction caused by ultraviolet rays of a peak wavelength of 172 nm emitted from the excimer lamp.

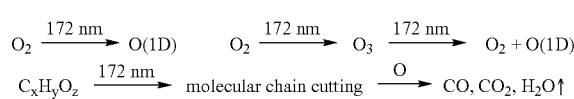
(Formula 2)

In the above-mentioned formula, O(1D) designates an stimulated oxygen atom having strong oxidative power. On the other hand, the ultraviolet rays cut the molecular chains of organic contaminations ($C_xH_yO_z$) Then, the stimulated oxygen atoms act on the organic contaminations cut thus, so as to oxidize the organic contaminations into CO, $CO_2$ and $H_2O$, and make them fly up from the surface of the light-emitting device.

Incidentally, as the low-pressure mercury lamp and the excimer lamp, for example, ones provided by USHIO INC. are available.

The time of irradiation with ultraviolet rays is not limited specifically. Since photolithography is batch-processed, irradiation with ultraviolet rays is carried out in a period (unoccupied time) between one batch and another. However, since there is no change in the properties of the light-emitting device, it is not necessary to control the time of irradiation with ultraviolet rays exactly. On the other hand, in the conventional chemical treatment method or the conventional $O_2$ plasma treatment method, the treatment time affects the properties of the light-emitting device so that it is necessary to control the treatment time exactly.

Irradiation with ultraviolet rays can be carried out at desired timing. There is a clear possibility that organic contaminations are produced when photolithography is carried out. It is therefore preferable that irradiation with ultraviolet rays is performed whenever the photolithography is carried out. Further, it is preferable that, also after the wafer is cut into chips, the chips are irradiated with ultraviolet rays. Thus, the reliability of ball bonding to the p-type seat electrode or the n-type seat electrode is improved.

Features and advantages of the invention will be evident from the following detailed description of the preferred embodiments described in conjunction with the attached drawings.

DETAILED DESCRIPTION OF THE PREFERRED EMBODIMENTS

Figure 1:
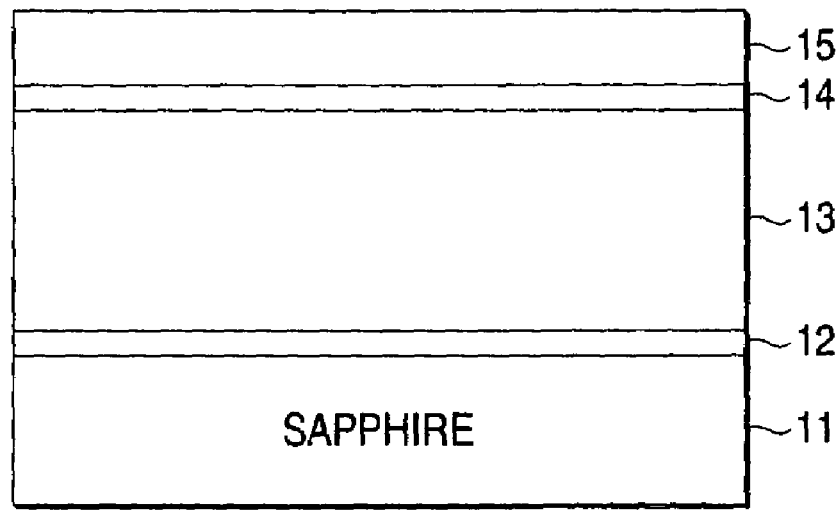
FIG. 1 is a sectional view showing a configuration of a group III nitride compound semiconductor layer of a light-emitting device according to an embodiment of the present invention.

Constituent parts of the present invention will be described below in detail.

In this specification, each group III nitride compound semiconductor is represented by the general formula: $Al_XGa_YIn_{1-X-Y}N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_xGa_{1-x}N$, $Al_xIn_{1-x}N$ and $Ga_xIn_{1-x}N$ (here, $0 \leq x \leq 1$) The group III elements may be partially replaced by boron (B), thallium (Tl), or the like. The nitrogen (N) may be partially replaced by phosphorus (P), arsenic (As), antimony (Sb), bismuth (Bi), or the like. The group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, the group III nitride compound semiconductor doped with p-type impurities may be irradiated with electron beams or with plasma or heated in a furnace. The method for forming each group III nitride compound semiconductor layer is not particularly limited. For example, the group III nitride compound semiconductor layer may be formed by a metal organic chemical vapor deposition method (MOCVD method) or may be formed by a well known method such as a molecular beam epitaxy method (MBE method), a halide vapor phase epitaxy method (HVPE method), a sputtering method, an ion-plating method, an electron showering method, etc.

Here, examples of the group III nitride compound semiconductor device may include electronic devices such as bipolar devices such as a rectifier, a thyristor, a transistor, etc.; unipolar devices such as FET, etc.; a microwave device; and so on; as well as optical devices such as a light-emitting diode, a receptor, a laser diode, a solar cell, etc.

Incidentally, a homo type structure, a hetero type structure, or a double hetero type structure may be used as the structure of the light-emitting device (in each of such cases, a layer contributing to light emission is referred to as a layer containing a light-emitting layer). A quantum well structure (a single quantum well structure or a multiple quantum well structure) may be provided as the layer containing a light-emitting layer.

In addition, a substrate of the light-emitting device is not particularly limited so long as group III nitride compound semiconductor layers can be grown on the substrate. Examples of the substrate materials may include sapphire, spinel ($MgAl_2O_4$), SiC (including 6H, 4H, and 3C), zinc oxide (ZnO), zinc sulfide (ZnS), magnesium oxide, group III nitride compound semiconductor single crystal (GaAs, GaP, etc.), silicon (Si), and so on. Especially, a sapphire substrate is preferably used.

It is preferable that the light-transmissible metal electrode is formed on the whole region of the p-type semiconductor. This is because, in the group III nitride compound semiconductor, the p-type semiconductor layer is generally high in electric resistance so that a current is evenly injected into the layer containing a light-emitting layer to make it possible to obtain sufficient light emission. Because the light-transmissible electrode is hence formed up to the edge portion of the p-type contact layer, the effective light-emitting portion reaches a side surface of the semiconductor laminate portion. As a result, intensive light is emitted from the side surface.

For example, an alloy containing cobalt and gold may be used as the light-transmissible electrode. In the alloy, the cobalt may be partially replaced by at least one element selected from the group consisting of nickel (Ni), iron (Fe), copper (Cu), chromium (Cr), tantalum (Ta), vanadium (V), manganese (Mn), aluminum (Al) and silver (Ag), and the gold may be partially replaced by at least one element selected from the group consisting of palladium (Pd), iridium (Ir) and platinum (Pt).

The light-transmissible electrode contains cobalt laminated as a first electrode layer with a film thickness of from 0.5 to 15 nm on the p-type contact layer, and gold laminated as a second electrode layer with a film thickness of from 3.5 to 25 nm on the cobalt layer. Then, the two layers are alloyed by heating process. After the heating process, the element distribution in a direction of the depth from the surface of the p-type contact layer is formed such that Au permeates the p-type contact layer more deeply than Co.

Here, the heating process is preferably performed in a gas containing oxygen. At least one member or a mixture gas of members selected from the group consisting of $O_2$, $O_3$, CO, $CO_2$, NO, $N_2O$, $NO_2$ and $H_2O$ may be used as the oxygen-containing gas. Alternatively, a mixture gas of an inert gas and at least one member selected from the group consisting of $O_2$, $O_3$, CO, $CO_2$, NO, $N_2O$, $NO_2$ and $H_2O$ may be used as the oxygen-containing gas. Alternatively, a mixture gas of an inert gas with a mixture gas of members selected from the group consisting of $O_2$, $O_3$, CO, $CO_2$, NO, $N_2O$, $NO_2$ and $H_2O$ may be used as the oxygen-containing gas. In short, the oxygen-containing gas means a gas containing oxygen atoms or a molecular gas containing oxygen atoms.

Any atmospheric pressure may be used in the heating process so long as the atmospheric pressure is not lower than the pressure in which the gallium nitride compound semiconductor is not thermally decomposed at the temperature used in the heating process. When only an $O_2$ gas is used as the oxygen-containing gas, the oxygen-containing gas may be introduced under the pressure not lower than the pressure of decomposition of the gallium nitride compound semiconductor. When a mixture gas of $O_2$ and another inert gas is used as the oxygen-containing gas, the oxygen-containing gas maybe introduced under the total pressure of the mixture gas set to be not lower than the pressure of decomposition of the gallium nitride compound semiconductor and under the partial pressure of the $O_2$ gas having a ratio not lower than about $10^{-6}$ to the total pressure of the mixture gas. In short, heating may be performed sufficiently if a very small amount of oxygen-containing gas is provided. Incidentally, the upper limit of the amount of the oxygen-containing gas to be introduced is not particularly limited on the basis of the characteristic of electrode alloying. That is, any amount of the oxygen-containing gas can be used so long as production can be made.

The temperature used in the heating process is most preferably in a range of from 500 to 600° C. A low-resistance ohmic contact between the electrode and the p-type and n-type semiconductors with an entirely saturated resistivity can be obtained at a temperature not lower than 500° C. The preferred temperature range is from 450 to 650° C.

The materials for forming the p-type seat electrode are not limited specifically. It is, however, preferable that a V layer, an Au layer and an Al layer are laminated successively as first to third metal layers from the bottom, so as to form a seat electrode material layer, and this seat electrode material layer is heated to form a p-type seat electrode.

To be able to be coupled with a lower layer firmly, the first metal layer is preferably formed out of an element having lower ionization potential than that of the second metal layer. The second metal layer is preferably formed out of an element which is superior in bonding properties to Al or Au and which does not react with the light-transmissible electrode. The third metal layer is preferably formed out of an element which can be coupled with the protective film firmly.

Preferably, the constituent element of the first metal layer is at least one element selected from the group consisting of nickel (Ni), iron (Fe), copper (Cu), chromium (Cr), tantalum (Ta), vanadium (V), manganese (Mn), aluminum (Al), silver (Ag) and cobalt (Co), and the thickness of the first metal layer is in a range of from 5 nm to 300 nm.

Preferably, the constituent element of the third metal layer is at least one element selected from the group consisting of aluminum (Al), nickel (Ni) and titanium (Ti), and the thickness of the third metal layer is in a range of from 1 nm to 30 nm.

Preferably, the constituent element of the second metal layer is gold (Au), and the thickness of the second metal layer is in a range of from 300 nm to 5,000 nm.

The n-type seat electrode is formed out of vanadium (V) and aluminum (Al). To form the n-type seat electrode, a semiconductor layer is etched beforehand till an n-type contact layer is exposed.

Description will be made below about an embodiment of the present invention.

According to the embodiment, a light-emitting diode 10 is provided. FIG. 1 shows the configuration of a group III nitride compound semiconductor layer of the light-emitting diode 10.

| Layer | composition |
|---|---|
| p-type semiconductor layer 15 | p-GaN:Mg |
| layer 14 containing a light-emitting layer | containing a layer of InGaN |
| n-type semiconductor layer 13 | n-GaN:Si |
| buffer layer 12 | AlN |
| Substrate 11 | |

The n-type layer 13 may be of a double-layered structure having an n⁻ layer of low electron density on the layer 14 side and an n⁺ layer of high electron density on the buffer layer 12 side. The latter is called n-type contact layer.

The layer 14 is not limited to the superlattice structure. A single hetero type structure, a double hetero type structure, a homo junction type structure, or the like, may be used as the structure of the light-emitting device.

A group III nitride compound semiconductor layer doped with an acceptor such as magnesium and having a wide band gap may be interposed between the layer 14 and the p-type layer 15. This interposition is carried out for effectively preventing electrons imparted into the layer 14 from diffusing into the p-type layer 15.

The p-type layer 15 may be of a double-layered structure having a p⁻ layer of low hole density on the layer 14 side and a p⁺ layer of high hole density on the electrode side. The latter is called p-type contact layer.

In the light-emitting diode configured as described above, each of the group III nitride compound semiconductor layers is formed by execution of MOCVD on a general condition.

Figure 2:
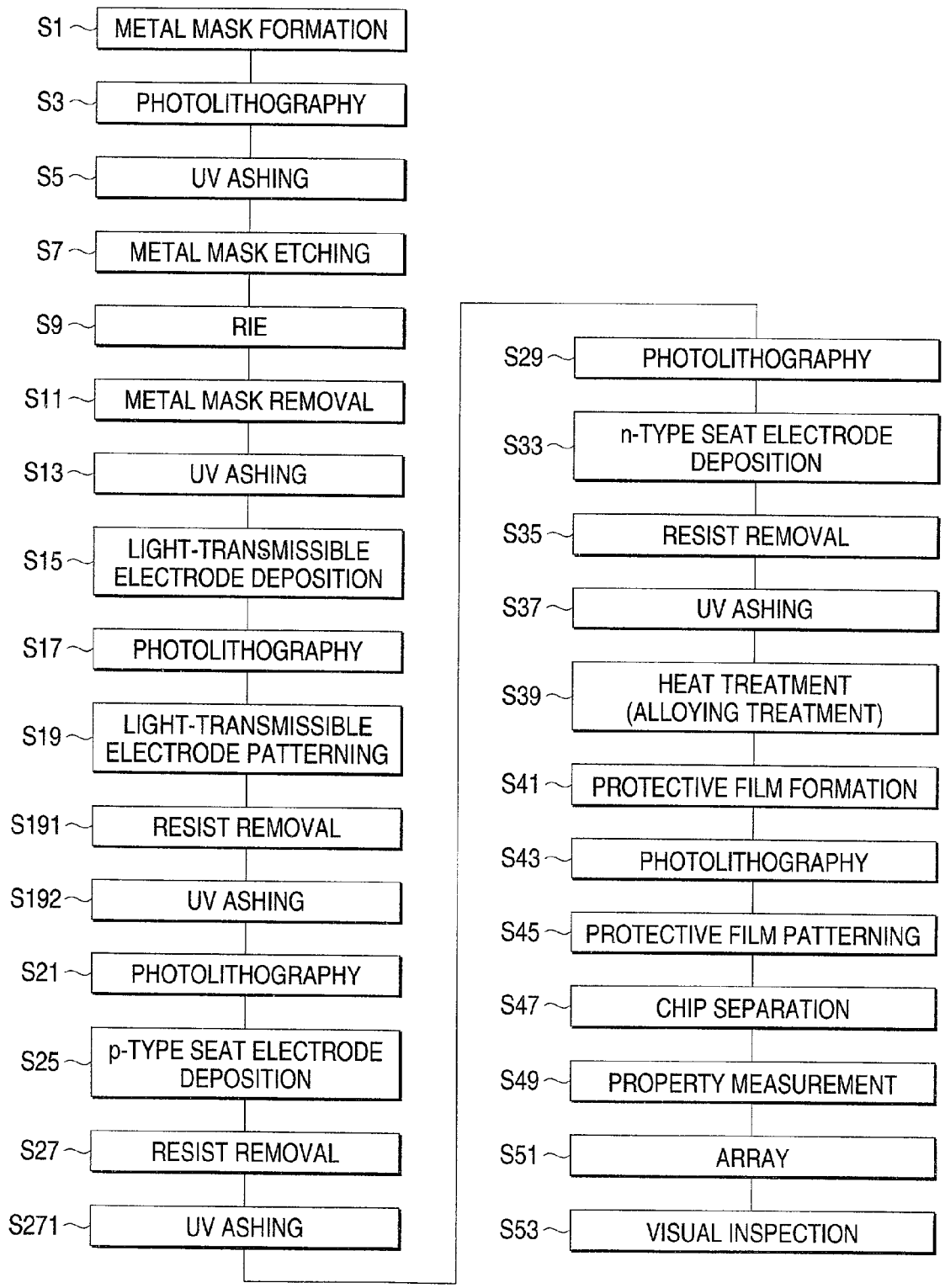
FIG. 2 shows manufacturing steps of the light-emitting device according to the embodiment.

Next, electrodes are formed in a series of steps including cleaning with ultraviolet rays as shown in FIG. 2. Further, a wafer is cut into chips. Incidentally, it will go well if cleaning is carried out at least once.

Figure 3:
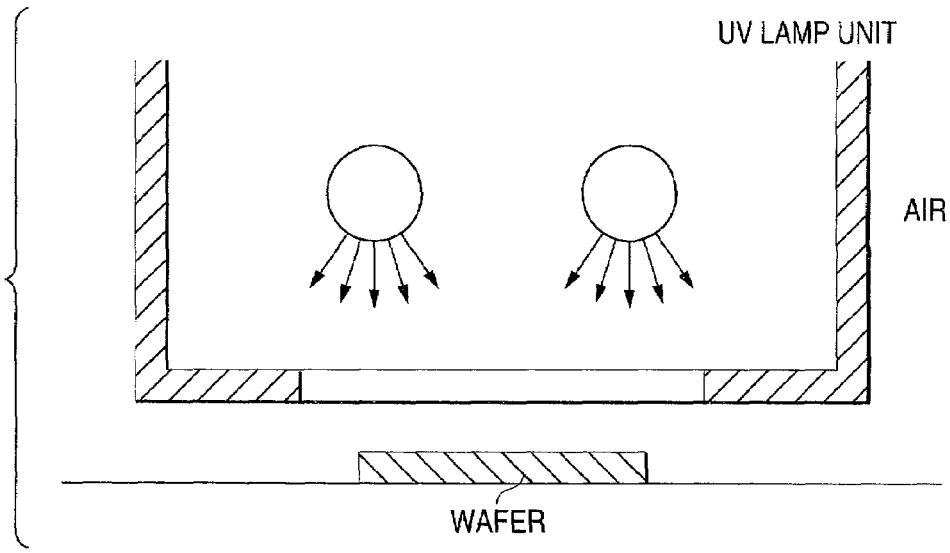
FIG. 3 shows an ultraviolet lamp unit according to the embodiment.

First, in Step 1, a metal mask (a laminated film of Ni/Ti/SiO₂) is formed all over the surface of a wafer. Then, a photo resist is laminated thereon and patterned (Step 3). By the patterning, a window is formed in the photo resist layer corresponding to an n-type seat electrode forming surface. After that, the wafer is took out, and irradiated with ultraviolet rays by an ultraviolet lamp unit (excimer lamp model: UER20-172 made by USHIO INC.) as shown in FIG. 3. Thus, ultraviolet ashing (cleaning) is carried out (Step 5). The conditions for the irradiation with ultraviolet rays are as follows. (Incidentally, the conditions for irradiation with ultraviolet rays in the steps after Step 5 are the same. The conditions for irradiation with ultraviolet rays may be changed in the respective ultraviolet ashing steps.)

| | |
|---|---|
| Ultraviolet ray central wavelength | 172 nm |
| half bandwidth | 14 nm |
| Irradiance | 10 mW/cm² |
| Irradiation distance | 2 mm |
| Irradiation time | 2 min |

If such irradiation is performed with ultraviolet rays, as shown in Formula 2:

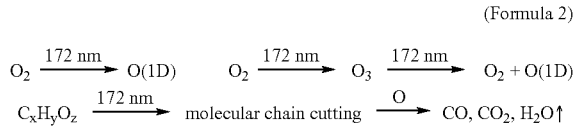
(Formula 2)

Figure 4:
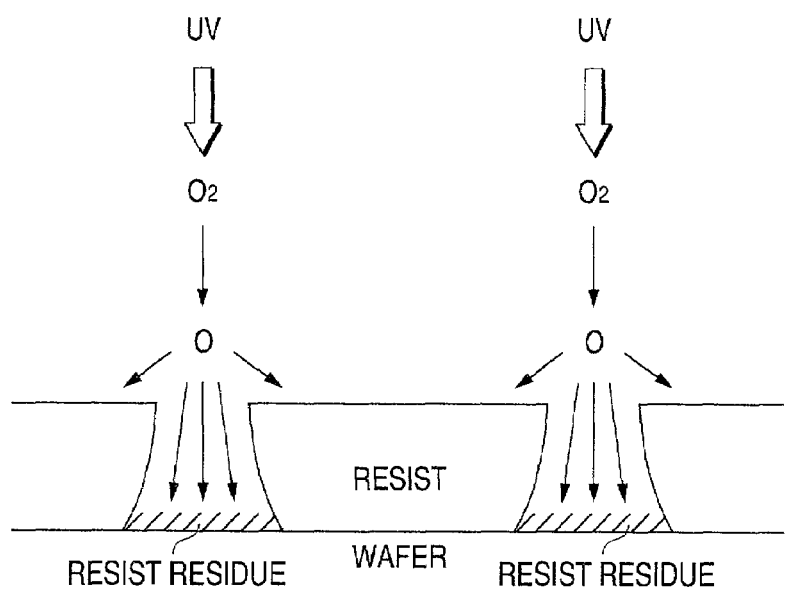
FIG. 4 is a schematic diagram showing a cleaning operation carried out upon resist residues.

Molecular chains of organic contaminations such as resist residues and so on are cut by the ultraviolet rays. Then, the organic contaminations cut thus are oxidized and decomposed into CO, $CO_2$ and $H_2O$ by stimulated oxygen atoms so as to fly up from the wafer surface. At this time, as shown in FIG. 4, the surface of the resist itself is eroded by the ultraviolet rays. However, since this resist is to be removed in the end, no influence is given to the properties of the light-emitting device.

In Step 7, the metal mask is etched by use of the patterned photo resist so as to form a window in the metal mask corresponding to the n-type seat electrode forming surface. After that, the photo resist is removed. Next, reactive ion etching is carried out in Step 9 so as to remove parts of the p-type layer 15, the layer 14 and the n-type layer 13. Thus, an n-type seat electrode forming surface 25 (see FIG. 5) is formed. After that, the metal mask is removed by etching (wet etching) (Step 11).

In Step 13, ultraviolet ashing is carried out again so as to remove contaminations and so on from the wafer surface.

In Step 15, light-transmissible electrode materials are deposited all over the surface of the wafer. In this embodiment, a Co (cobalt) layer (1.5 nm) and an Au (gold) layer (6 nm) are laminated sequentially as the light-transmissible electrode materials. In Step 17, a photo resist is laminated onto the deposited light-transmissible electrode materials, and photolithography is carried out. Then, in Step 19, the light-transmissible electrode materials are patterned. After that, the resist is removed by organic solvent treatment (Step 191), and slight resist residues left on the surface are removed by ultraviolet ashing (Step 192).

In Step 21, photo resist lamination and photolithography are carried out so as to form a window in a portion where a p-type seat electrode is to be formed. Then, in Step 25, a V (vanadium) layer (17.5 nm), an Au layer (1.5 µm), and an Al (aluminum) layer (10 nm) are deposited and laminated sequentially as p-type seat electrode formation materials. In Step 27, the resist is removed, and a p-type seat electrode 17 (a laminate of the above-mentioned materials in this state) is formed by a lift-off method. After that, ashing is carried out again with ultraviolet rays in Step 271.

In Step 29, photo resist lamination and photolithography are carried out so as to form a window in a portion where an n-type seat electrode is to be formed. Then, in Step 33, a V (vanadium) layer (18 nm) and an Al (aluminum) layer (2 µm) are deposited and laminated sequentially as n-type seat electrode forming materials. In Step 35, the resist is removed, and an n-type seat electrode 18 (a laminate of the above-mentioned materials in this state) is formed by a lift-off method. After that, ashing is carried out again with ultraviolet rays in Step 37.

In Step 39, the wafer obtained thus is put into a heating furnace, and the heating furnace is exhausted to 1 Pa or lower, and thereafter supplied with $O_2$ to over 10 Pa. Then, in that state, the temperature of the furnace is set to 550° C., and heat treatment is carried out for about 4 minutes. Thus, the light-transmissible electrode 16 and the p-type seat electrode 17 are alloyed, and the n-type seat electrode 18 is alloyed. In addition, ohmic junctions between those alloys and the p-type and n-type semiconductors are formed respectively.

After that, in Step 41, an $SiO_2$ protective film is formed all over the wafer by a CVD method. In Step 43, a photo resist layer is formed on the protective film, and photolithography is further carried out. In Step 45, the protective film is dry-etched through a window formed in the resist layer in Step 43, and the resist layer is further removed.

Figure 5:
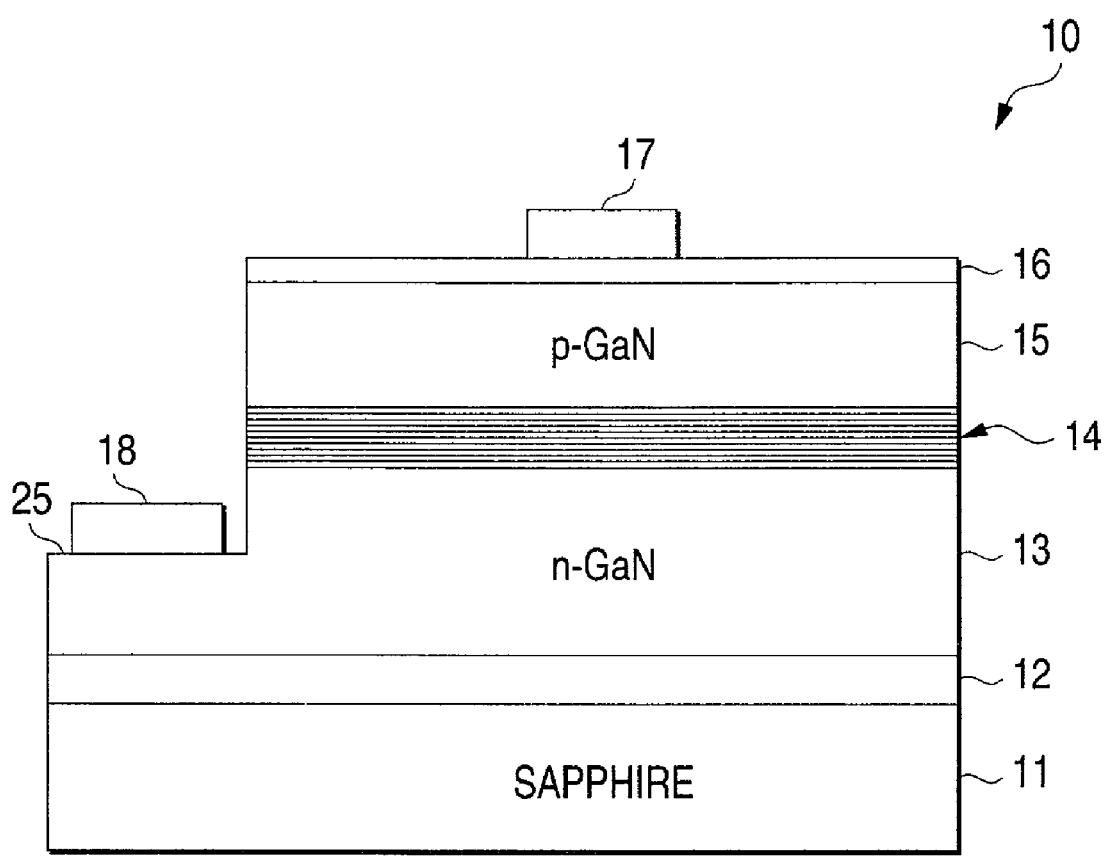
FIG. 5 shows the light-emitting device according to the embodiment.

In Step 47, the wafer is cut and divided into chips shown in FIG. 5, by a conventional method. Then, property measurement (Step 49), array (Step 51) and visual inspection (Step 53) are carried out. Incidentally, also in the steps after the chip cutting step 47, it is preferable that the chips are cleaned by irradiating the chips with ultraviolet rays. A p-type GaN layer is comparatively high in resistance so that it is apt to be electrified. As a result, there is a fear that organic contaminations having polarity adhere to the surface of the p-type seat electrode 17 or the surface of the n-type seat electrode 18. Such contaminations are oxidized and removed by carrying out such cleaning. As a result, the reliability of ball bonding is improved.

The yield in manufacturing of the light-emitting devices according to this embodiment was 95%. On the other hand, the yield in manufacturing of the light-emitting devices was 85% when cleaning with ultraviolet rays in this embodiment was replaced by conventional chemical treatment.

Although a device constituted by a group III nitride compound semiconductor has been described above by way of example, the cleaning method according to the present invention is applicable also to devices constituted by semiconductors other than group III nitride compound semiconductors.

The present invention is not limited to the embodiment and the description thereof at all. Various modifications which can be easily conceived by those skilled in the art may be contained in the present invention without departing from the description of the scope of claim.

The following items are disclosed.

A group III nitride compound semiconductor device as a first disclosure, wherein a cleaning step is carried out on a p-type group III nitride compound semiconductor layer with ultraviolet rays when an electrode is to be formed on the P-type group III nitride compound semiconductor layer.

A group III nitride compound semiconductor device as a second disclosure, wherein a cleaning step is carried out on the group III nitride compound semiconductor device with ultraviolet rays after the group III nitride compound semiconductor device is cut out of a wafer.

A group III nitride compound semiconductor device according to the first or second disclosure, wherein the ultraviolet rays have a central wavelength of 172 nm.

A group III nitride compound semiconductor device according to the first or second disclosure, wherein the ultraviolet rays are emitted from an excimer lamp.

A group III nitride compound semiconductor device according to any one of the first, second and thereafter disclosures, wherein the group III nitride compound semi-conductor device is a light-emitting device or a light-receiving device.

A method for manufacturing a semiconductor device, as a third disclosure, comprising the step of: irradiating a surface of a wafer with ultraviolet rays to thereby clean the surface of the wafer.

A method for manufacturing a semiconductor device according to the third disclosure, wherein the ultraviolet rays have a central wavelength of 172 nm.

A method for manufacturing a semiconductor device according to the third disclosure, wherein the ultraviolet rays are emitted from an excimer lamp.

A method for manufacturing a semiconductor device according to any one of the third and thereafter disclosures, wherein the cleaning step is carried out on a p-type semiconductor layer.

A method for cleaning a semiconductor device having electrodes on a p-type semiconductor layer, as a fourth disclosure, comprising the step of: irradiating the semiconductor device with ultraviolet rays before and/or after the electrodes are formed.

A cleaning method according to the fourth disclosure, wherein the ultraviolet rays have a central wavelength of 172 nm.

A cleaning method according to the fourth disclosure, wherein the ultraviolet rays are emitted from an excimer lamp.

A method for cleaning a semiconductor device cut out of a wafer, as a fifth disclosure, comprising the step of: irradiating the semiconductor device with ultraviolet rays to thereby clean the semiconductor device.

A cleaning method according to the fifth disclosure, wherein the ultraviolet rays have a central wavelength of 172 nm.

A cleaning method according to the fifth disclosure, wherein the ultraviolet rays are emitted from an excimer lamp.

A semiconductor device as a sixth disclosure, wherein a cleaning step is carried out on a P-type semiconductor layer with ultraviolet rays when an electrode is to be formed on the P-type semiconductor layer.

A semiconductor device as a seventh disclosure, wherein a cleaning step is carried out on the semiconductor device with ultraviolet rays after the semiconductor device is cut out of a wafer.

A semiconductor device according to the sixth or seventh disclosure, wherein the ultraviolet rays have a central wavelength of 172 nm.

A semiconductor device according to the sixth or seventh disclosure, wherein the ultraviolet rays are emitted from an excimer lamp.

A semiconductor device according to one of the sixth, seventh and thereafter disclosures, wherein the semiconductor device is a light-emitting device or a light-receiving device.

What is claimed is:

1. A method for manufacturing a group III nitride compound semiconductor device, comprising:
    forming a resist layer on a group III nitride compound semiconductor in a wafer;
    patterning said resist layer; and
    irradiating a surface of said wafer with ultraviolet rays to thereby clean a resist residue from said surface of said wafer, said surface comprising said group III nitride compound semiconductor,
    wherein said ultraviolet rays cause a reaction of oxygen molecules to form stimulated oxygen atoms having a strong oxidative power at said surface of said wafer, and
    wherein said irradiating said surface of said wafer is performed in a gaseous environment and after said patterning said resist layer, wherein said irradiating said surface of said wafer comprises irradiating a surface of said group III nitride compound semiconductor.

2. A method for manufacturing a group III nitride compound semiconductor device according to claim 1, wherein said ultraviolet rays have a central wavelength of 172 nm.

3. A method for manufacturing a group III nitride compound semiconductor device according to claim 1, wherein said ultraviolet rays are emitted from an excimer lamp.

4. A method for manufacturing a group III nitride compound semiconductor device according to claim 1, wherein said stimulated oxygen atoms oxidize an organic contamination on said surface of said wafer into $CO$, $CO_2$ and $H_2O$ which flies up from said surface.

5. A method for manufacturing a group III nitride compound semiconductor device according to claim 1, wherein said group III nitride compound semiconductor comprises a p-type semiconductor, and said irradiating said surface comprises irradiating a surface of said p-type semiconductor to clean a resist residue from said surface of said p-type semiconductor.

6. A method for manufacturing a group III nitride compound semiconductor device according to claim 1, wherein said oxygen molecules are supplied to said surface of said wafer by supplying an oxygen-containing gas to said surface.

7. A method for manufacturing a group III nitride compound semiconductor device according to claim 1, wherein said irradiating said surface of said wafer comprises locating said wafer in an area of an ultraviolet lamp unit which emits said ultraviolet rays.

8. A method for manufacturing a group III nitride compound semiconductor device according to claim 1, wherein said irradiating said surface of said wafer comprises irradiating an entirety of said surface of said wafer.

9. A method for manufacturing a group III nitride compound semiconductor device according to claim 1, wherein said irradiating said surface of said wafer comprises using said ultraviolet rays to cut a molecular chain of said resist residue, and reacting said stimulated oxygen atoms with said cut molecular chain to decompose said resist residue.

10. A method for manufacturing a group III nitride compound semiconductor device, comprising:
    forming a resist layer on said group III nitride compound semiconductor;
    patterning said resist layer; and
    irradiating a surface of said group III nitride compound semiconductor with ultraviolet rays to remove a resist residue from said surface,
    wherein said irradiating said surface is performed in a gaseous environment and after said patterning said resist layer, and
    wherein said ultraviolet rays:
        cut a molecular chain of said resist residue; and
        cause a reaction of oxygen molecules to form stimulated oxygen atoms having a strong oxidative power at said surface, said stimulated oxygen atoms reacting with said cut molecular chain to decompose said resist residue.

11. The method of claim 10, wherein said surface of said group III nitride compound semiconductor comprises a light-transmissible metal electrode formed thereon.

12. The method of claim 11, wherein said light-transmissible metal electrode comprises an alloy comprising cobalt and gold.

13. The method of claim 10, further comprising:
    supplying said oxygen molecules to said surface by supplying an oxygen-containing gas to said surface, wherein said ultraviolet rays have a central wavelength of 172 nm and are emitted from an excimer lamp, wherein said stimulated oxygen atoms oxidize an organic contamination on said surface into CO, $CO_2$ and $H_2O$ which flies up from said surface, wherein said group III nitride compound semiconductor comprises a p-type semiconductor, and said irradiating said surface comprises irradiating said p-type semiconductor to clean a resist residue from said p-type semiconductor, and wherein said irradiating said surface comprises irradiating an entirety of said surface.

* * * * *